United States Patent
Hirata

(10) Patent No.: US 12,538,822 B2
(45) Date of Patent: Jan. 27, 2026

(54) SEMICONDUCTOR DEVICE WITH IMPROVED CONTROL CIRCUIT PATTERN PLACEMENT

(71) Applicant: FUJI ELECTRIC CO., LTD., Kawasaki (JP)

(72) Inventor: Tomoya Hirata, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 504 days.

(21) Appl. No.: 18/193,293

(22) Filed: Mar. 30, 2023

(65) Prior Publication Data
US 2023/0238334 A1 Jul. 27, 2023

Related U.S. Application Data

(63) Continuation of application No. PCT/JP2022/007329, filed on Feb. 22, 2022.

(30) Foreign Application Priority Data

Apr. 12, 2021 (JP) ................................. 2021-067123

(51) Int. Cl.
*H01L 23/538* (2006.01)
*H01L 23/00* (2006.01)
(Continued)

(52) U.S. Cl.
CPC ........ *H01L 23/5386* (2013.01); *H01L 23/367* (2013.01); *H01L 23/40* (2013.01);
(Continued)

(58) Field of Classification Search
CPC ................................................ H01L 23/5386
(Continued)

(56) References Cited

U.S. PATENT DOCUMENTS

2007/0228534 A1* 10/2007 Uno ........................ H01L 24/48
257/E23.079
2012/0313252 A1   12/2012 Ueda et al.
(Continued)

FOREIGN PATENT DOCUMENTS

EP           3010040 A1    4/2016
JP         H09181219 A    7/1997
(Continued)

OTHER PUBLICATIONS

International Search Report for PCT/JP2022/007329, mailed on May 17, 2022.
Written Opinion for PCT/JP2022/007329, mailed on May 17, 2022.

*Primary Examiner* — Ajay Arora
(74) *Attorney, Agent, or Firm* — Rabin & Berdo, P.C.

(57) ABSTRACT

A semiconductor device includes a cooling base board and an insulated circuit substrate. On a front surface of an insulated board on the insulated circuit substrate, a high potential circuit pattern on which a semiconductor chip is mounted, an intermediate potential circuit pattern on which a semiconductor chip is mounted, a low potential circuit pattern, and a control circuit pattern are disposed so as to straddle a center line of the cooling base board. The intermediate potential circuit pattern includes a second chip mounting region, an output wiring connection region and an interconnect wiring region that form a U-shaped portion in which the high potential circuit pattern having a semiconductor chip thereon is disposed. The control circuit pattern is disposed so as to straddle the center line and faces the opening of the U-shaped portion.

17 Claims, 8 Drawing Sheets

(51) Int. Cl.
  *H01L 23/367* (2006.01)
  *H01L 23/40* (2006.01)
  *H01L 25/065* (2023.01)

(52) U.S. Cl.
  CPC .......... *H01L 24/48* (2013.01); *H01L 25/0655* (2013.01); *H01L 2224/48247* (2013.01)

(58) Field of Classification Search
  USPC ........................................................ 257/668
  See application file for complete search history.

(56) References Cited

U.S. PATENT DOCUMENTS

| | | |
|---|---|---|
| 2016/0093589 A1 | 3/2016 | Sato et al. |
| 2020/0194386 A1 | 6/2020 | Uezato |
| 2020/0395343 A1 | 12/2020 | Kakefu et al. |
| 2021/0143093 A1 | 5/2021 | Ichikawa |
| 2021/0217741 A1* | 7/2021 | Ishimatsu ............... H01L 25/16 |

FOREIGN PATENT DOCUMENTS

| | | |
|---|---|---|
| JP | 2012256746 A | 12/2012 |
| JP | 2016072421 A | 5/2016 |
| JP | 2018139337 A | 9/2018 |
| WO | 2019167509 A1 | 9/2019 |
| WO | 2020059285 A1 | 3/2020 |
| WO | 2020170553 A1 | 8/2020 |

* cited by examiner

SEMICONDUCTOR DEVICE WITH IMPROVED CONTROL CIRCUIT PATTERN PLACEMENT

CROSS-REFERENCE TO RELATED APPLICATION

This application is a continuation application of International Application PCT/JP2022/007329 filed on Feb. 22, 2022, which designated the U.S., which claims priority to Japanese Patent Application No. 2021-067123, filed on Apr. 12, 2021, the entire contents of which are incorporated herein by reference.

BACKGROUND OF THE INVENTION

1. Field of the Invention

The embodiment discussed herein relates to a semiconductor device.

2. Background of the Related Art

Semiconductor devices include power devices and are used as power conversion devices. The power devices are insulated gate bipolar transistors (IGBTs) and power metal oxide semiconductor field effect transistors (MOSFETs), for example. A semiconductor device includes semiconductor chips including power devices and a plurality of ceramic circuit substrates on which the semiconductor chips are mounted. The plurality of ceramic circuit substrates are disposed on a cooling base board. Heat from the semiconductor chips is transferred to the ceramic circuit substrates and is then dissipated from the cooling base board. Thereby, the semiconductor chips are cooled. In addition, the cooling base board of the semiconductor device is screwed at four corners to a predetermined mounting area.

International Publication Pamphlet No. WO 2020/059285

However, when heat is generated by the semiconductor chips, the ceramic circuit substrates and cooling base board warp due to a difference in linear expansion coefficient. Especially, since the cooling base board is fastened to the predetermined mounting area, stress is concentrated in the warped portion of the cooling base board. The ceramic circuit substrates on the cooling base board are not able to follow the warpage of the cooling base board, but crack due to the stress. Such damage of the ceramic circuit substrates leads to a reduction in the reliability of the semiconductor device.

SUMMARY OF THE INVENTION

According to an aspect, there is provided a semiconductor device, including: first and second semiconductor chips; a cooling base board that is rectangular in a plan view of the semiconductor device, and has a first side, a second side, a third side and a fourth side in this order; and an insulated circuit substrate disposed on a front surface of the cooling base board so as to straddle a center line of the cooling base board that passes through a center of the cooling base board in a direction parallel to the first side and the third side, the insulated circuit substrate including an insulating plate and further including, on a front surface of the insulating plate, a high potential circuit pattern on which the first semiconductor chip is mounted, an intermediate potential circuit pattern on which the second semiconductor chip is mounted, a low potential circuit pattern, and a control circuit pattern, wherein the high potential circuit pattern includes a first chip mounting region adjacent to the center line at a side of the center line where the first side is located, the first chip mounting region having the first semiconductor chip mounted thereon, the intermediate potential circuit pattern includes: a second chip mounting region adjacent to the center line on a side of the center line where the third side is located, the second chip mounting region having the second semiconductor chip mounted thereon; an output wiring connection region facing the second chip mounting region; and an interconnect wiring region disposed so as to straddle the center line and connect the second chip mounting region and the output wiring connection region, the second chip mounting region, the output wiring connection region and the interconnect wiring region forming a U-shaped portion in the plan view with an opening facing the fourth side, the U-shaped portion partially surrounding at least a part of the first chip mounting region, and the control circuit pattern is disposed so as to straddle the center line and faces the opening of the U-shaped portion.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, an embodiment will be described with reference to the accompanying drawings. In the following description, the terms "front surface" and "top surface" refer to surfaces facing the +Z direction in a semiconductor device 10. Similarly, the term "up" refers to the +Z direction in the semiconductor device 10. The terms "rear surface" and "bottom surface" refer to surfaces facing the −Z direction in the semiconductor device 10. Similarly, the term "down" refers to the −Z direction in the semiconductor device 10. The term "side surface" refers to a surface connecting a "front surface" or "top surface" and a "rear surface" or "bottom surface" in the semiconductor device 10. For example, a "side surface" is a surface facing one of the ±X directions and ±Y directions in the semiconductor device 10.

The same directionality applies to all drawings. The terms "front surface," "top surface," "up," "rear surface," "bottom surface," "down," and "side surface" are used for convenience to describe relative positional relationships, and do not limit the technical ideas of the embodiments. For example, the terms "up" and "down" are not always related to the vertical directions to the ground. That is, the "up" and "down" directions are not limited to the gravity direction. In addition, in the following description, the term "main component" refers to a component contained at a volume ratio of 80 vol % or more.

Figure 1:
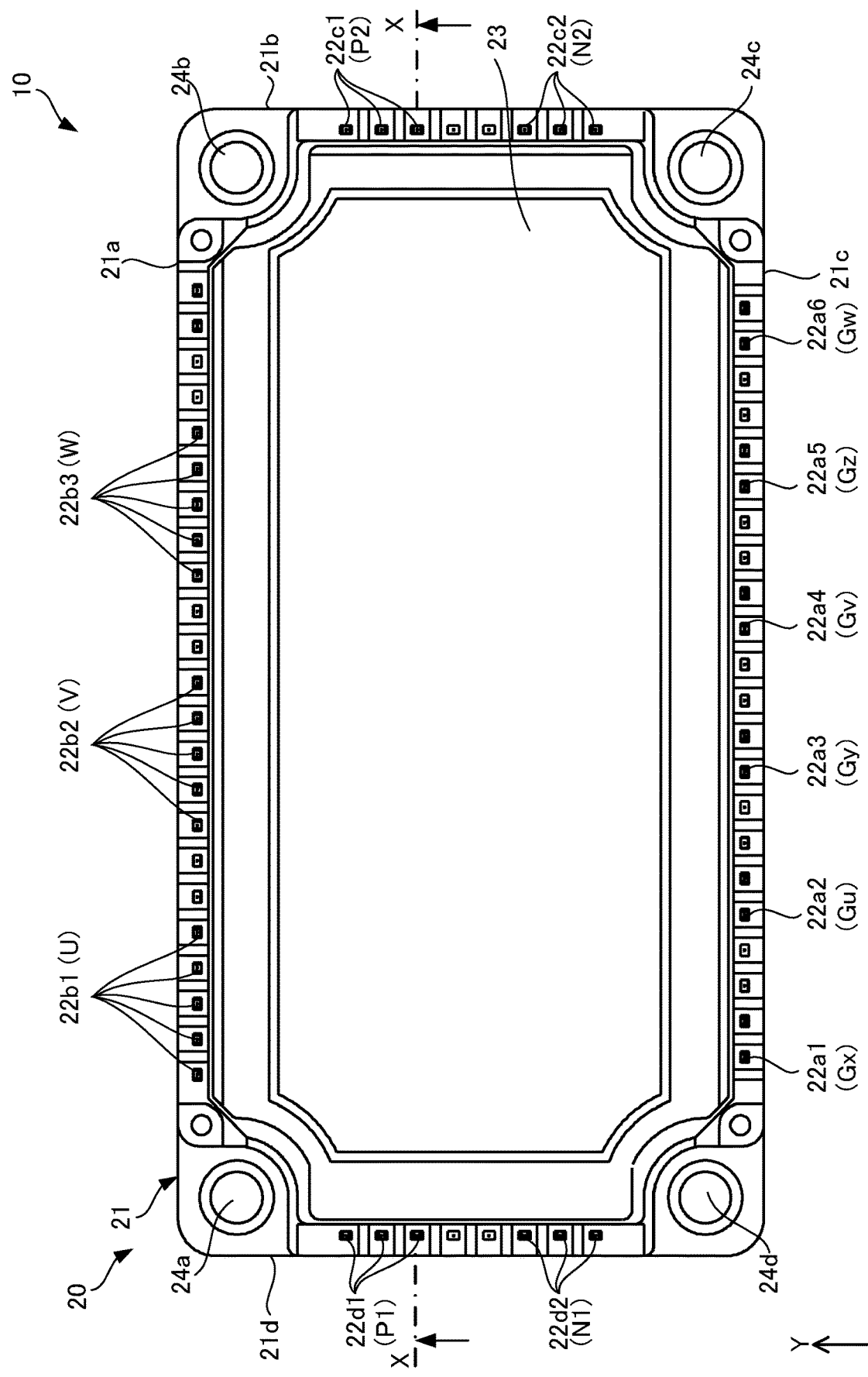
FIG. 1 is a plan view of a semiconductor device according to one embodiment.

The following describes a semiconductor device according to one embodiment. First, the appearance of the semiconductor device will be described with reference to FIG. 1. FIG. 1 is a plan view of the semiconductor device according to the embodiment. The semiconductor device 10 includes semiconductor chips (to be described later), ceramic circuit substrates (to be described later), and a case 20 accommodating the semiconductor chips and ceramic circuit substrates. In this connection, the semiconductor chips include diode elements and switching elements. In addition, a cooling base board 70 (see FIG. 3) is exposed downward (in the −Z direction) from the rear surface of the case 20 of the semiconductor device 10. The case 20 is rectangular in plan view. The case 20 includes a sidewall 21, a lid 23, and four fastening holes 24a to 24d.

The sidewall 21 is rectangular (frame-shaped) in plan view. The sidewall 21 has a housing space (to be described later) at the center thereof, and has a first wall 21a, a second wall 21b, a third wall 21c, and a fourth wall 21d that surround the four sides of the housing space in order. In this connection, the third wall 21c is located opposite to the first wall 21a on the −Y side thereof. In addition, the fourth wall 21d is located opposite to the second wall 21b on the −X side thereof. The first wall 21a and third wall 21c form long sides, whereas the second wall 21b and fourth wall 21d form short sides. In addition, the sidewall 21 only needs to have the first wall 21a to the fourth wall 21d that are straight on the four sides of its rectangular shape. The corners of the sidewall 21 may be curved (with curved surfaces).

In addition, in the sidewall 21, a plurality of terminals are provided along the periphery of the front surface of the sidewall 21, and extend upward (in the +Z direction) from the front surface of the sidewall 21. The plurality of terminals include external connection terminals for the main electrodes, control, and outputs of the ceramic circuit substrates (inverter) to be described later. The external connection terminals for main electrode are second P terminals 22c1, second N terminals 22c2, first P terminals 22d1, and first N terminals 22d2. The second P terminals 22c1 and second N terminals 22c2 are arranged in the direction from the first wall 21a toward the third wall 21c on the second wall 21b. The first P terminals 22d1 and first N terminals 22d2 are arranged in the direction from the first wall 21a toward the third wall 21c on the fourth wall 21d.

The external connection terminals for control are a Gx terminal 22al, a Gu terminal 22a2, a Gy terminal 22a3, a Gv terminal 22a4, a Gz terminal 22a5, and a Gw terminal 22a6. These external connection terminals for control are arranged in the direction from the fourth wall 21d toward the second wall 21b on the third wall 21c. The external connection terminals for output are U terminals 22bl, V terminals 22b2, and W terminals 22b3. These external connection terminals for output are arranged in the direction from the fourth wall 21d toward the second wall 21b on the first wall 21a.

Figure 3:
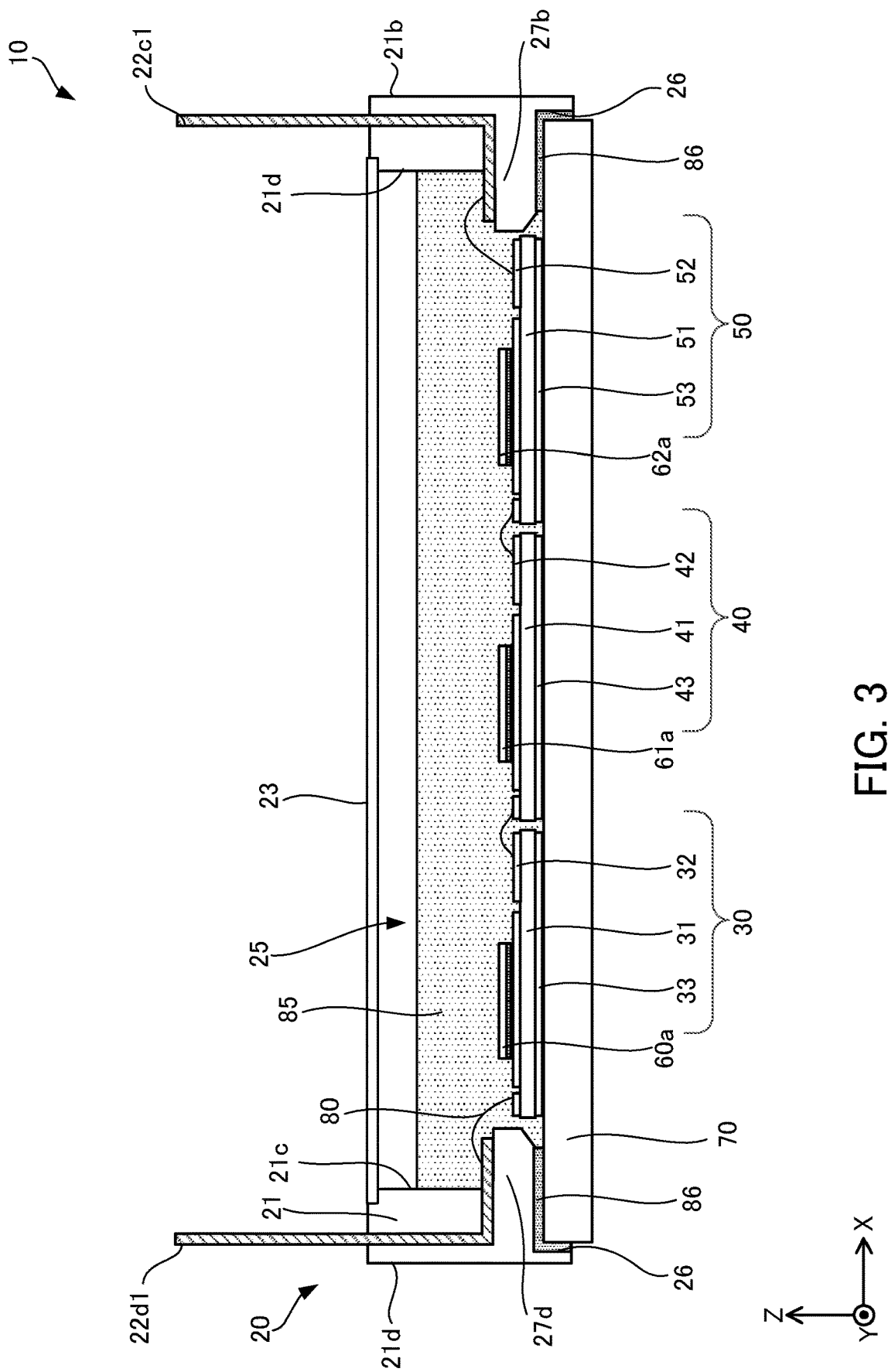
FIG. 3 is a sectional view of the semiconductor device according to the embodiment.

The lid 23 is provided to cover the opening of the housing space that accommodates the components (semiconductor chips and others) of the semiconductor device 10 therein (see FIG. 3). The fastening holes 24a to 24d are respectively provided at the four corners of the sidewall 21 in plan view. Screws are inserted into the fastening holes 24a to 24d. The semiconductor device 10 is attached to a predetermined position by inserting the screws into the fastening holes 24a to 24d. In addition, the screws pass through the fastening holes 24a to 24d and then fit into through holes (to be described later) of the cooling base board 70, so that the cooling base board 70 is fastened together with the case 20.

The above case 20 is integrally formed with the plurality of terminals using a resin. The resin here contains a thermoplastic resin as a main component. Examples of the thermoplastic resin include a polyphenylene sulfide resin, a polybutylene terephthalate resin, a polybutylene succinate resin, a polyamide resin, and an acrylonitrile butadiene styrene resin. In addition, the lid 23 is made of the same material separately.

The cooling base board 70 is made of a material with high thermal conductivity, such as aluminum, iron, silver, copper, or an alloy containing at least one of these. In addition, to improve corrosion resistance, for example, plating or the like may be performed on the surface of the cooling base board 70 using a material such as nickel. In this connection, other than nickel, a nickel-phosphorus alloy, a nickel-boron alloy, and others are usable. This cooling base board 70 has a rectangular shape in plan view, and has a first side surface 70a to a fourth side surface 70d in order (see FIG. 4). More specifically, the third side surface 70c is located opposite to the first side surface 70a on the −Y side thereof. In addition, the fourth side surface 70d is located opposite to the second side surface 70b on the −X side thereof. The first side surface 70a and third side surface 70c form long sides, whereas the second side surface 70b and fourth side surface 70d form short sides. In addition, the cooling base board 70 only needs to have the first side surface 70a to the fourth side surface 70d that are straight on the four sides of its rectangular shape. The corners of the cooling base board 70 may be curved (with curved surfaces). The first side surface 70a to fourth side surface 70d of the cooling base board 70 face the first wall 21a to fourth wall 21d of the case 20, respectively. In addition, through holes 74a to 74d are formed at the four corners of the cooling base board 70. The through holes 74a to 74d correspond in position and inner diameter to the fastening holes 24a to 24d of the case 20. When the semiconductor device 10 is attached to a predetermined position, screws are inserted into both the fastening holes 24a to 24d of the case 20 and the through holes 74a to 74d, respectively.

In this connection, a cooling device (not illustrated) may be attached to the rear surface of the cooling base board 70 to improve heat dissipation property. The cooling device may be attached, by screwing into the fastening holes 24a to 24d or by bonding using a solder, a silver solder, or the like. In this case, the cooling device is made of a material with high thermal conductivity, such as aluminum, iron, silver, copper, or an alloy containing at least one of these. In addition, as the cooling device, a heat sink with a plurality of fins or a cooling device using cool water may be used, for example. In addition, the cooling base board 70 may be formed integrally with such a cooling device. In this case, the cooling base board 70 is made of a material with high thermal conductivity, such as aluminum, iron, silver, copper, or an alloy containing at least one of these. In addition, to improve corrosion resistance, for example, plating or the like may be performed on the surface of the cooling base board 70 integrally formed with the cooling device, using a material such as nickel. In this connection, other than nickel, a nickel-phosphorus alloy, a nickel-boron alloy, and others are usable.

Figure 2:
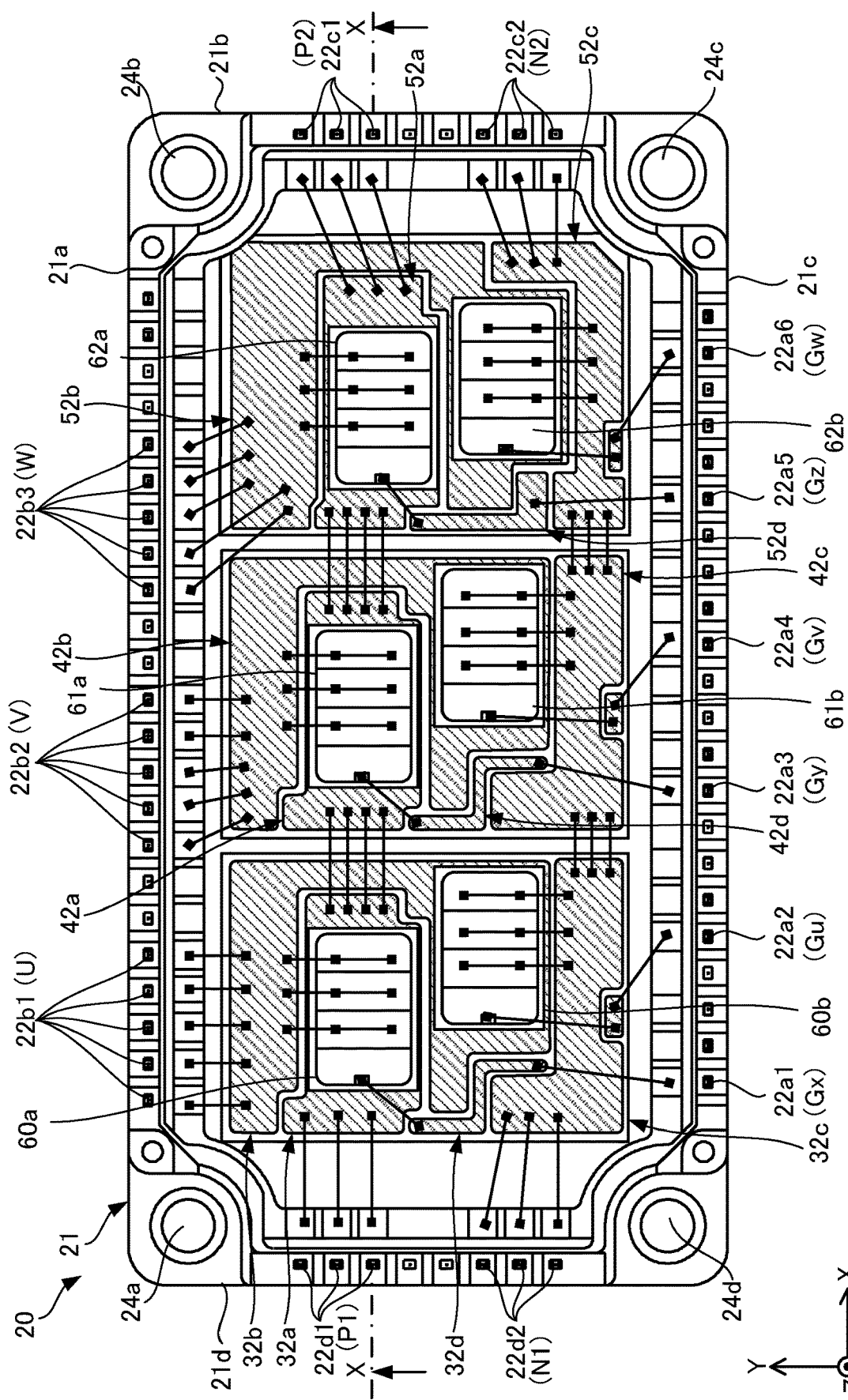
FIG. 2 is a plan view of the inside of the semiconductor device according to the embodiment.
Figure 4:
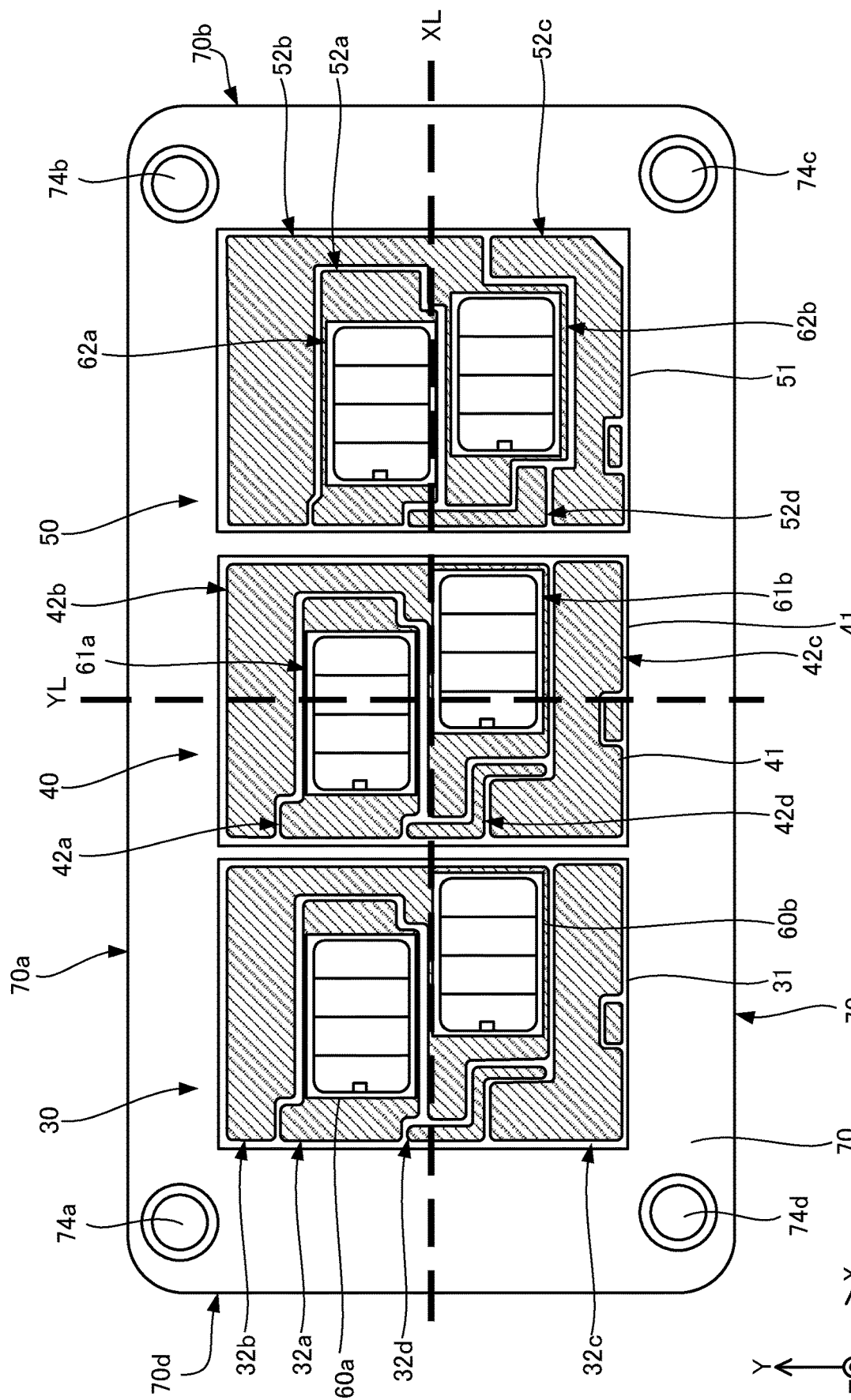
FIG. 4 is a plan view of a cooling base board included in the semiconductor device according to the embodiment.

The following describes the internal configuration of the semiconductor device 10 with reference to FIGS. 2 to 4. FIG. 2 is a plan view of the inside of the semiconductor device according to the embodiment. FIG. 3 is a sectional view of the semiconductor device according to the embodiment. FIG. 4 is a plan view of the cooling base board included in the semiconductor device according to the embodiment. In this connection, FIG. 3 is a sectional view taken along dot-dashed lines X-X of FIGS. 1 and 2. In addition, the illustration of a sealing material and the lid is omitted in FIG. 2. FIG. 4 illustrates, in plan view, only the cooling base board 70 on which ceramic circuit substrates are disposed, and the illustration of the other configuration is omitted. FIG. 4 illustrates a center line XL that passes through the central point of the cooling base board 70 in parallel to the long-side direction and a center line YL that passes through the central point of the cooling base board 70 in parallel to the short-side direction.

As described earlier, the semiconductor device 10 includes the case 20, and the semiconductor chips 60a to 62a and 60b to 62b and ceramic circuit substrates 30, 40, and 50 that are accommodated in the case 20. In the following description, the semiconductor chips 60a to 62a and 60b to 62b may be collectively referred to as semiconductor chips.

As described earlier, the sidewall 21 of the case 20 has a rectangular frame shape in plan view, and has the first wall 21a, second wall 21b, third wall 21c, and fourth wall 21d (see FIG. 2). The case 20 has the housing space 25 surrounded by the sidewall 21.

As illustrated in FIG. 3, a sealing material 85 is provided in the housing space 25 of the case 20. The sealing material 85 seals the front surfaces of the ceramic circuit substrates 30, 40, and 50, the semiconductor chips 60a to 62a and 60b to 62b, and wires 80. The sealing material 85 used here contains a thermosetting resin and a filler, which is contained in the thermosetting resin. Examples of the thermosetting resin include an epoxy resin, a phenolic resin, and a maleimide resin. One example of the sealing material 85 is an epoxy resin containing a filler. An inorganic material is used as the filler. Examples of the inorganic material include silicon oxide, aluminum oxide, boron nitride, and aluminum nitride. Alternatively, the sealing material 85 may be a silicone gel. The wires 80 collectively refer to wires used in the semiconductor device 10. The wires will be described by different roles later.

The semiconductor device 10 includes an inverter circuit. The inverter circuit converts direct current to alternating current. Direct current input from the high potential second P terminals 22c1 and first P terminals 22d1 and the low potential second N terminals 22c2 and first N terminals 22d2 is converted by the plurality of semiconductor chips 60a to 62a and 60b to 62b and is then output as three-phase alternating current from the U terminals 22b1, V terminals 22b2, and W terminals 22b3.

As illustrated in FIG. 2, the sidewall 21 has external connection terminals for main electrode on the second wall 21b (on the +X side). These external connection terminals are the second P terminals 22c1 and the second N terminals 22c2. The second P terminals 22c1 and the second N terminals 22c2 are arranged near the first wall 21a and the third wall 21c, respectively, on the second wall 21b. The sidewall 21 has external connection terminals for main electrode on the fourth wall 21d (on the −X side). These external connection terminals are the first P terminals 22d1 and the first N terminals 22d2. The first P terminals 22d1 and the first N terminals 22d2 are arranged near the first wall 21a and the third wall 21c, respectively, on the fourth wall 21d.

The sidewall 21 has external connection terminals for control on the third wall 21c (on the −Y side). These external connection terminals are the Gx terminal 22a1, Gu terminal 22a2, Gy terminal 22a3, Gv terminal 22a4, Gz terminal 22a5, and Gw terminal 22a6. The external connection terminals for control are arranged in the direction from the fourth wall 21d toward the second wall 21b on the third wall 21c. In addition, the Gx terminal 22a1 and Gu terminal 22a2 correspond to the ceramic circuit substrate 30. The Gy terminal 22a3 and Gv terminal 22a4 correspond to the ceramic circuit substrate 40. The Gz terminal 22a5 and Gw terminal 22a6 correspond to the ceramic circuit substrate 50.

The sidewall 21 has external connection terminals for output on the first wall 21a (on the +Y side). These external connection terminals are the U terminals 22b1, V terminals 22b2, and W terminals 22b3, and are arranged in the direction from the fourth wall 21d toward the second wall 21b on the first wall 21a. In addition, the U terminals 22b1, V terminals 22b2, and W terminals 22b3 correspond to the ceramic circuit substrates 30, 40, and 50, respectively.

In addition, as illustrated in FIG. 3, the housing space 25 penetrates through the case 20 in the vertical direction (±Z directions). The first wall 21a, second wall 21b, third wall 21c, and fourth wall 21d have projections that are respectively formed along the first wall 21a, second wall 21b, third wall 21c, and fourth wall 21d and project toward the housing space 25. In this connection, FIG. 3 illustrates the projection 27d of the fourth wall 21d and the projection 27b of the second wall 21b. Each projection has principal surfaces that are perpendicular to the inner wall of the sidewall 21 and face the vertical directions (±Z directions).

In addition, the case 20 has a frame portion 26 formed on the rear surface side of the sidewall 21. More specifically, the cooling base board 70 is firmly attached via an adhesive 86 to the rear surfaces of the projections (projections 27d and 27b in FIG. 3) of the sidewall 21. The ceramic circuit substrates 30, 40, and 50, to be described later, are disposed on the cooling base board 70. FIG. 3 illustrates a first P terminal 22d1 and a second P terminal 22c1. The first P terminal 22d1 and second P terminal 22c1 have an L shape in side view and are respectively embedded in the fourth wall 21d and second wall 21b. The first P terminal 22d1 and second P terminal 22c1 each have one end extending upward (in +Z direction) from the front surface of the case 20, and the other end exposed on the corresponding projection of the second wall 21b and fourth wall 21d so as to face upward (+Z direction). The other terminals as well as the first P terminal 22d1 and second P terminal 22c1 are integrally formed with the first wall 21a, second wall 21b, third wall 21c, and fourth wall 21d in the same manner.

The plurality of terminals are made of a material with high electrical conductivity, such as copper, aluminum, iron, or an alloy containing at least one of these. In addition, to improve corrosion resistance, for example, plating or the like may be performed on the surfaces of the plurality of terminals, using a material such as nickel, gold, tin, or an alloy containing at least one of these.

As illustrated in FIGS. 2 to 4, the ceramic circuit substrates 30, 40, and 50 are rectangular in plan view. The ceramic circuit substrates 30, 40, and 50 are arranged in order in the direction from the fourth wall 21d toward the second wall 21b on the cooling base board 70 in the housing space 25. The ceramic circuit substrates 30, 40, and 50 have ceramic boards 31, 41, and 51 and metal plates 33, 43, and 53 formed on the rear surfaces of the ceramic boards 31, 41, and 51, respectively. In addition, the ceramic circuit substrates 30, 40, and 50 have circuit patterns 32, 42, and 52 formed on the front surfaces of the ceramic boards 31, 41, and 51, respectively. In this connection, the circuit patterns 32, 42, and 52 collectively refer to a plurality of circuit patterns included in the ceramic circuit substrates 30, 40, and 50, respectively. The circuit patterns 32, 42, and 52 will be described in detail later. The ceramic boards 31, 41, and 51 and metal plates 33, 43, and 53 are rectangular in plan view. In addition, the corners of the ceramic boards 31, 41, and 51 and the corners of the metal plates 33, 43, and 53 formed on the rear surfaces of the ceramic boards 31, 41, and 51 may be rounded or chamfered. The metal plates 33, 43, and 53 are smaller in size than the ceramic boards 31, 41, and 51 in plan view, and are formed inside the ceramic boards 31, 41, and 51, respectively.

The ceramic boards 31, 41, and 51 are made of a ceramic material with high thermal conductivity as a main component. For example, the ceramic material contains aluminum oxide, aluminum nitride, or silicon nitride as a main component. The ceramic boards 31, 41, and 51 have a thickness of 0.2 mm to 2.5 mm, inclusive.

The metal plates 33, 43, and 53 are made of a metal with high thermal conductivity as a main component. Examples of the metal include copper, aluminum, and an alloy containing at least one of these. In addition, the metal plates 33, 43, and 53 have a thickness of 0.1 mm to 5.0 mm, inclusive. To improve corrosion resistance, plating may be performed on the surfaces of the metal plates 33, 43, and 53. Examples of a plating material used here include nickel, a nickel-phosphorus alloy, and a nickel-boron alloy.

The circuit patterns 32, 42, and 52 are made of a metal with high electrical conductivity as a main component. Examples of the metal here include copper, aluminum, and an alloy containing at least one of these. In addition, the circuit patterns 32, 42, and 52 have a thickness of 0.1 mm to 5.0 mm, inclusive. To improve corrosion resistance, plating may be performed on the surfaces of the circuit patterns 32, 42, and 52. Examples of a plating material used here include nickel, a nickel-phosphorus alloy, and a nickel-boron alloy. The circuit patterns 32, 42, and 52 are formed by forming a metal layer on each front surface of the ceramic boards 31, 41, and 51 and performing etching or another on the metal layers. Alternatively, the circuit patterns 32, 42, and 52 cut out of a metal plate in advance may be press-bonded to the front surfaces of the ceramic boards 31, 41, and 51.

The circuit patterns 32, 42, and 52 include high potential circuit patterns 32a, 42a, and 52a, intermediate potential circuit patterns 32b, 42b, and 52b, low potential circuit patterns 32c, 42c, and 52c, and control circuit patterns 32d, 42d, and 52d, respectively. The high potential circuit patterns 32a, 42a, and 52a are disposed adjacent to the center line XL on the side thereof closer to the first side surface 70a. The semiconductor chips 60a, 61a, and 62a are bonded to the high potential circuit patterns 32a, 42a, and 52a, respectively.

The intermediate potential circuit patterns 32b, 42b, and 52b have a U-shape with portions thereof parallel to the first side surface 70a, second side surface 70b, and third side surface 70c so as to surround the high potential circuit patterns 32a, 42a, and 52a, respectively. The semiconductor chips 60b, 61b, and 62b are bonded adjacent to the center line XL on the side thereof closer to the third side surface 70c on the intermediate potential circuit patterns 32b, 42b, and 52b, respectively. In this connection, in plan view, the semiconductor chips 60a, 61a, and 62a are positioned closer to the fourth side surface 70d than the semiconductor chips 60b, 61b, and 62b, respectively.

The low potential circuit patterns 32c, 42c, and 52c are respectively disposed adjacent to the semiconductor chips 60b, 61b, and 62b of the intermediate potential circuit patterns 32b, 42b, and 52b on the side thereof closer to the third side surface 70c. The control circuit patterns 32d, 42d, and 52d straddle the center line XL and are mainly disposed on the side of the center line XL closer to the fourth side surface 70d. In this connection, the circuit patterns 32, 42, and 52 will be described in detail later.

As each ceramic circuit substrate 30, 40, and 50 configured as above, a direct copper bonding (DCB) substrate or an active metal brazed (AMB) substrate may be used. In the ceramic circuit substrates 30, 40, and 50, heat generated by a semiconductor chip may be transferred via a circuit pattern 32, 42, or 52, a ceramic board 31, 41, or 51, and a metal plate 33, 43, or 53 to outside.

The semiconductor chips 60a to 62a and 60b to 62b are made of silicon as a main component. These semiconductor chips 60a to 62a and 60b to 62b include reverse-conducting (RC)-IGBTs. An RC-IGBT has the functions of both an IGBT and a free wheeling diode (FWD) The semiconductor chips 60a to 62a and 60b to 62b of this type each have an input electrode (collector electrode) serving as a main electrode on the rear surface thereof, and have a gate electrode serving as a control electrode and an output electrode (emitter electrode) serving as a main electrode on the front surface thereof. Alternatively, the semiconductor chips 60a to 62a and 60b to 62b may be power MOSFETs made of silicon carbide as a main component. The semiconductor chips 60a to 62a and 60b to 62b of this type each have an input electrode (drain electrode) serving as a main electrode on the rear surface thereof, and have a gate electrode serving as a control electrode and an output electrode (source electrode) serving as a main electrode on the front surface thereof.

In this connection, in place of the semiconductor chips 60a to 62a and 60b to 62b, switching elements and diode elements may be provided. In this case, a switching element is an IGBT or power MOSFET, for example. In the case where the switching element is an IGBT, the switching element has an input electrode (collector electrode) serving as a main electrode on the rear surface thereof, and has a gate electrode serving as a control electrode and an output electrode (emitter electrode) serving as a main electrode on the front surface thereof. In the case where the switching element is a power MOSFET, the switching element has an input electrode (drain electrode) serving as a main electrode on the rear surface thereof, and has a gate electrode serving as a control electrode and an output electrode (source electrode) serving as a main electrode on the front surface thereof.

A diode element is a Schottky barrier diode (SBD) or a P-intrinsic-N (PiN) diode, for example. The diode element of this type has a cathode electrode serving as a main electrode on the rear surface thereof and has an anode electrode serving as a main electrode on the front surface thereof. The rear surface of the above diode element is bonded to a circuit pattern (reference numeral omitted) using a solder (not illustrated). In this connection, electronic components may be mounted as appropriate, according to the design, specifications, and others of the semiconductor device 10. Examples of the electronic components include resistors, capacitors, and thermistors.

These semiconductor chips 60a to 62a and 60b to 62b are bonded to the circuit patterns 32, 42, and 52 using a solder. A lead-free solder is used as the solder. The lead-free solder contains, as a main component, at least one of a tin-silver-copper alloy, a tin-zinc-bismuth alloy, a tin-copper alloy, and a tin-silver-indium-bismuth alloy. In addition, the solder may contain an additive. A sintered metal may be used, instead of the solder. The sintered metal is made of silver or a silver alloy as a main component.

The ceramic circuit substrates 30, 40, and 50 and semiconductor chips 60a to 62a and 60b to 62b are accommodated in the housing space 25 surrounded by the sidewall 21 of the case 20. In the housing space 25, the circuit patterns 32, 42, and 52, semiconductor chips 60a to 62a and 60b to 62b, and the plurality of terminals are electrically and mechanically connected with the wires 80, where appropriate. By doing so, an inverter circuit is formed in the housing space 25. In this connection, the wires 80 are made of a metal with high electrical conductivity as a main component. Examples of the metal here include gold, silver, copper, aluminum, and an alloy containing at least one of these. Among the wires 80, wires 80 connecting to the control electrodes of the semiconductor chips 60a to 62a and 60b to 62b may have a smaller diameter than the other wires 80. This makes it possible to reduce the sizes of bonding areas and makes it easy to achieve fine wiring. For example, the wires 80 for control have a diameter of 50 μm to 250 μm, inclusive, whereas the wires 80 for the other purposes have a diameter of 300 μm to 600 μm, inclusive.

Figure 5:
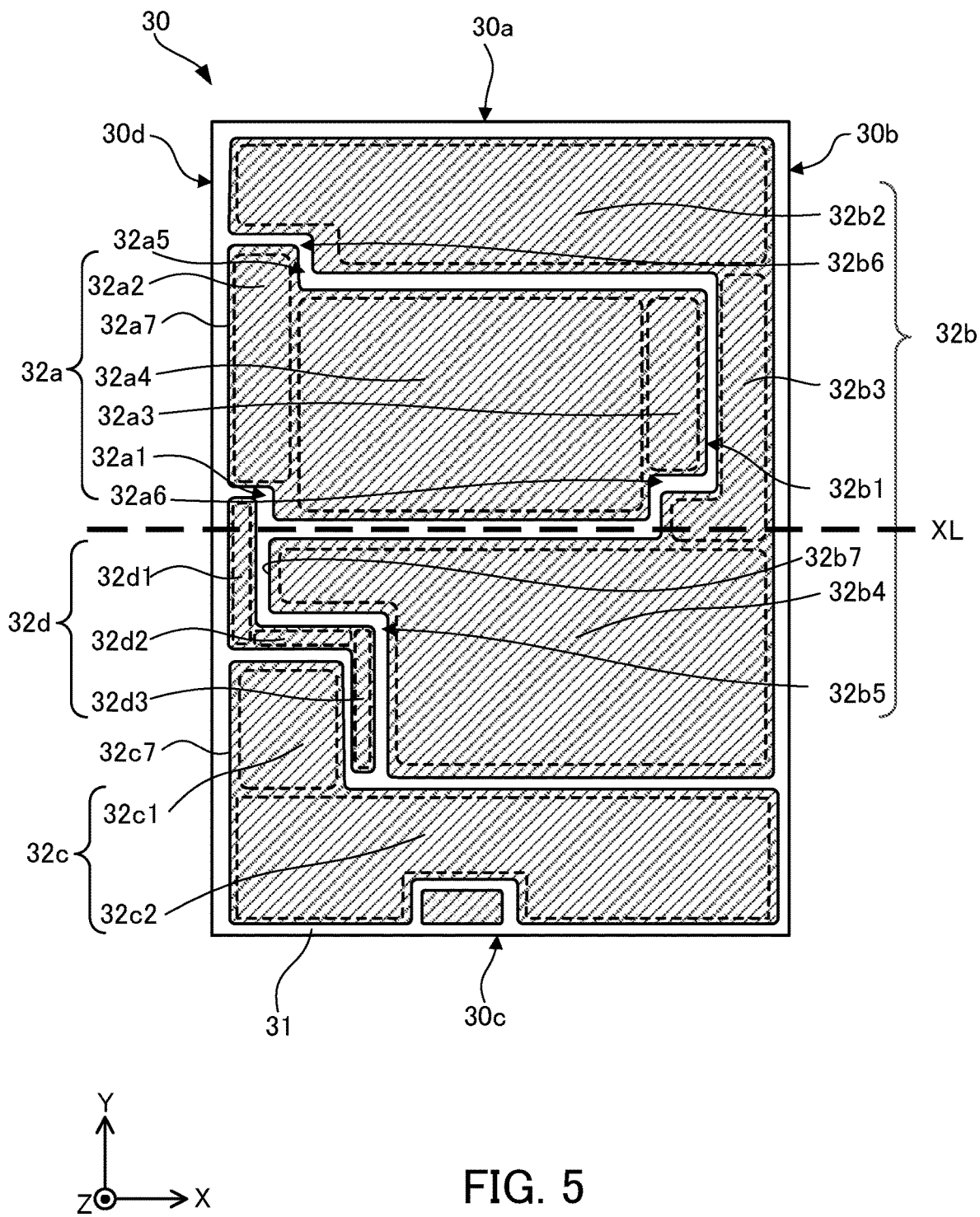
FIG. 5 is a plan view of a circuit pattern of a ceramic circuit substrate included in the semiconductor device according to the embodiment (part 1)
Figure 6:
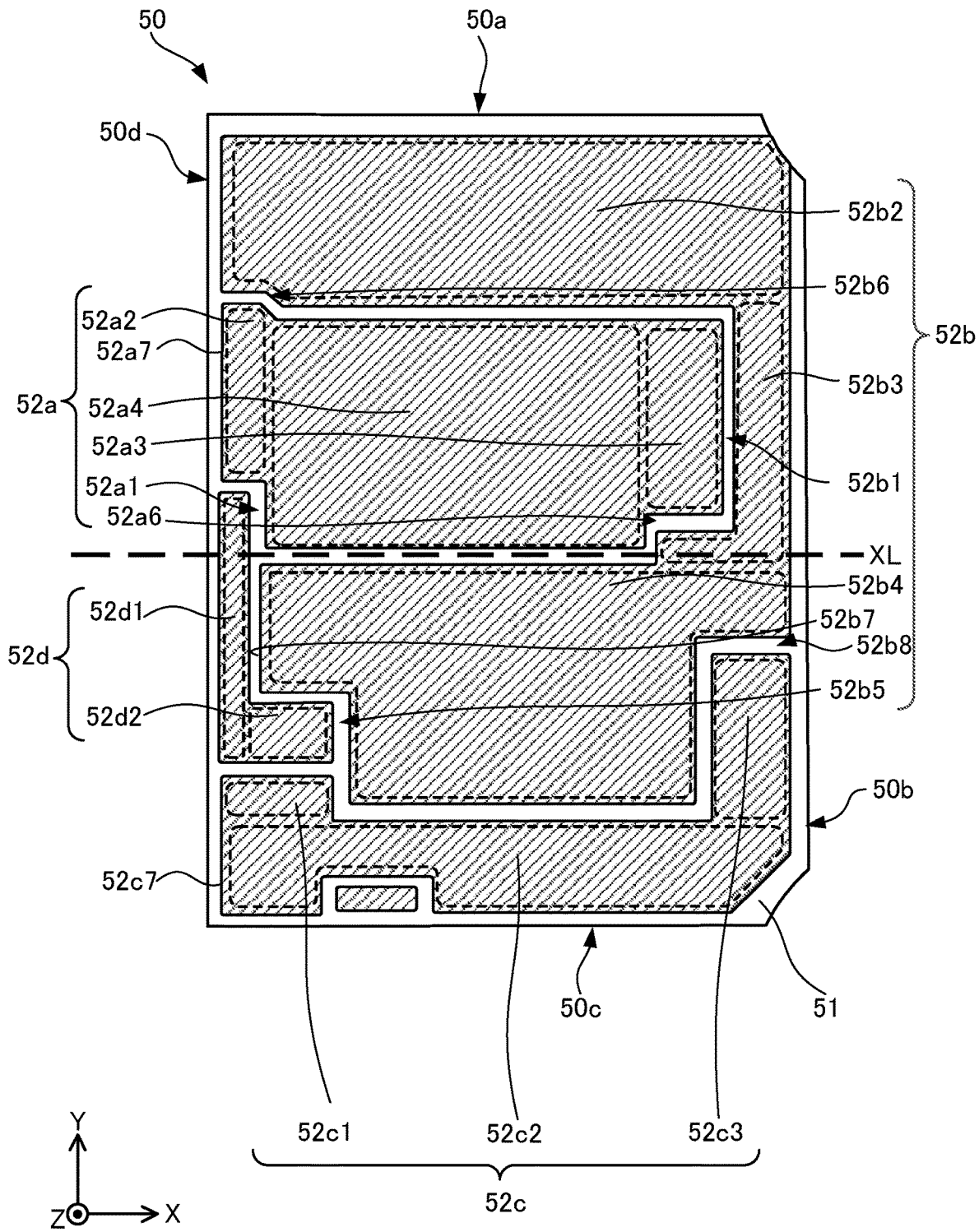
FIG. 6 is a plan view of a circuit pattern of a ceramic circuit substrate included in the semiconductor device according to the embodiment (part 2)

The following describes the circuit patterns 32, 42, and 52 included in the ceramic circuit substrates 30, 40, and 50 with reference to FIGS. 5 and 6. FIGS. 5 and 6 are each a plan view of a circuit pattern of a ceramic circuit substrate included in the semiconductor device according to the present embodiment. Since the circuit patterns 32 and 42 have the same shape, the circuit pattern 32 will now be described, and the description on the circuit pattern 42 will be omitted. FIGS. 5 and 6 illustrate the circuit patterns 32 and 52 of the ceramic circuit substrates 30 and 50, respectively.

As illustrated in FIG. 5, the ceramic board 31 included in the ceramic circuit substrate 30 has a rectangular shape in plan view, and has a first side 30a to a fourth side 30d in order. More specifically, the third side 30c is located opposite to the first side 30a on the −Y side thereof. The fourth side 30d is located opposite to the second side 30b on the −X side thereof. The first side 30a and third side 30c are short sides, whereas the second side 30b and fourth side 30d are long sides. The first side 30a to fourth side 30d of the ceramic board 31 face the first side surface 70a to fourth side surface 70d of the cooling base board 70, respectively, and also face the first wall 21a to fourth wall 21d of the case 20, respectively.

As described earlier, on the ceramic board 31, the high potential circuit pattern 32a, intermediate potential circuit pattern 32b, low potential circuit pattern 32c, and control circuit pattern 32d are formed.

The high potential circuit pattern 32a has wiring connection regions 32a2 and 32a3 and a chip mounting region 32a4, and also has a first cutout 32a1 formed therein. The wiring connection region 32a2 is disposed separate from the center line XL toward the first side 30a, and a side portion 32a7 (high potential side edge) of the wiring connection region 32a2 facing the fourth side 30d is disposed adjacent to the fourth side 30d along the fourth side 30d. In addition, the wiring connection region 32a2 is positioned closer to the first side 30a than the chip mounting region 32a4. The wiring connection region 32a3 is disposed separate from the center line XL toward the first side 30a, and close to but separate from the second side 30b in parallel to the second side 30b. The chip mounting region 32a4 is disposed adjacent to the center line XL on the side thereof closer to the first side 30a. On this chip mounting region 32a4, the semiconductor chip 60a is disposed such that the control electrode 60a1 of the semiconductor chip 60a faces the fourth side 30d (see FIG. 7).

The first cutout 32a1 is formed at a corner of the high potential circuit pattern 32a that is located closest to the third side 30c in the edge portion of the high potential circuit pattern 32a facing the fourth side 30d. More specifically, the first cutout 32a1 is defined by the edge portion of the wiring connection region 32a2 facing the third side 30c and the edge portion of the chip mounting region 32a4 facing the fourth side 30d. The first cutout 32a1 is rectangular in plan view. The length in the +Y direction of the first cutout 32a1 may be set to be as small as to allow a wire 80 to be connected to the wiring connection region 32a2.

In this connection, in the present embodiment, the high potential circuit pattern 32a has formed therein a cutout 32a5 at a corner that is located closest to the second side 30b in the edge portion of the high potential circuit pattern 32a facing the first side 30a and a cutout 32a6 at a corner that is located closest to the third side 30c in the edge portion of the high potential circuit pattern 32a facing the second side 30b. In other words, the cutout 32a5 at the corner that is located closest to the second side 30b in the edge portion of the high potential circuit pattern 32a facing the first side 30a is formed by projecting the wiring connection region 32a2 toward the first side 30a. In addition, the cutout 32a6 at the corner that is located closest to the third side 30c in the edge portion of the high potential circuit pattern 32a facing the second side 30b is formed by shifting the position of the edge portion of the chip mounting region 32a4 facing the third side 30c toward the third side 30c.

The intermediate potential circuit pattern 32b has a U-shape with an opening facing the fourth side 30d. The intermediate potential circuit pattern 32b includes an output wiring connection region 32b2, an interconnect wiring region 32b3, and a chip mounting region 32b4. The output wiring connection region 32b2 is disposed on the side of the center line XL closer to the first side 30a with the high potential circuit pattern 32a interposed between the center line XL and the output wiring connection region 32b2. In addition, the output wiring connection region 32b2 extends from the second side 30b to the fourth side 30d along the first side 30a. The output wiring connection region 32b2 has a third cutout 32b6 formed in a portion that is located closest to the fourth side 30d in the edge portion of the output wiring connection region 32b2 facing the third side 30c.

The chip mounting region 32b4 is disposed adjacent to the center line XL on the side thereof closer to the third side 30c. More specifically, the chip mounting region 32b4 is disposed adjacent to the chip mounting region 32a4 of the high potential circuit pattern 32a on the side thereof closer to the third side 30c. A side portion 32b7 (intermediate potential side edge) of the chip mounting region 32b4 facing the fourth side 30d is located separate from the fourth side 30d toward the second side 30b. The chip mounting region 32b4 has formed therein a second cutout 32b5 at a corner that is located closest to the fourth side 30d in the edge portion of the chip mounting region 32b4 facing the third side 30c. The chip mounting region 32b4 and the output wiring connection region 32b2 face each other with the high potential circuit pattern 32a interposed therebetween. The semiconductor chip 60b is mounted on the chip mounting region 32b4 such that the control electrode 60b1 of the semiconductor chip 60b faces the fourth side 30d (see FIG. 7). That is, when viewed in the +Y direction, the control electrode 60a1 of the semiconductor chip 60a is positioned closer to the fourth side 30d than the control electrode 60b1 of the semiconductor chip 60b.

The interconnect wiring region 32b3 is disposed adjacent to the second side 30b along the second side 30b so as to straddle the center line XL. In addition, the interconnect wiring region 32b3 integrally connects a corner portion of the output wiring connection region 32b2 that faces the third side 30c and is adjacent to the second side 30b and a corner portion of the chip mounting region 32b4 that faces the first side 30a and is adjacent to the second side 30b. The interconnect wiring region 32b3 has a projection that projects toward the fourth side 30d from a corner portion that is located closest to the fourth side 30d in the edge portion of the interconnect wiring region 32b3 facing the third side 30c. That is to say, the interconnect wiring region 32b3 has a recess in a portion that is located closer to the first side 30a and that faces the fourth side 30d.

This U-shaped portion forming the recess 32b1 of the intermediate potential circuit pattern 32b is formed by the output wiring connection region 32b2, interconnect wiring region 32b3, and chip mounting region 32b4. The U-shaped portion partially surrounds the high potential circuit pattern 32a. In this case, the chip mounting region 32a4 of the high potential circuit pattern 32a is interposed between the output wiring connection region 32b2 and the chip mounting region 32b4. In addition, the edge portion of the wiring connection region 32a2 of the high potential circuit pattern 32a facing the first side 30a is arranged in the third cutout 32b6, and the wiring connection region 32a3 is arranged in the recess of the interconnect wiring region 32b3.

Therefore, in the intermediate potential circuit pattern 32b, the output wiring connection region 32b2, the recess 32b1 (where the chip mounting region 32a4 is arranged), and the chip mounting region 32b4 are arranged in parallel to the second side 30b and fourth side 30d. In addition, the center line XL passes between the chip mounting regions 32a4 and 32b4.

The low potential circuit pattern 32c includes a projecting region 32c1 and a conductive region 32c2. The conductive region 32c2 is disposed adjacent to the third side 30c and extends from the fourth side 30d to the second side 30b along the third side 30c. The conductive region 32c2 may have a U-shaped portion with a recess in the edge portion thereof facing the third side 30c, and another circuit pattern may be formed in this recess of the U-shaped portion. In addition, the projecting region 32c1 projects toward the first side 30a from a corner portion of the conductive region 32c2 that is located closest to the fourth side 30d in the edge portion of the conductive region 32c2 facing the first side 30a. In addition, a side portion 32c7 (low potential side edge) of the low potential circuit pattern 32c facing the fourth side 30d is disposed adjacent to the fourth side 30d.

The control circuit pattern 32d is disposed so as to straddle the center line XL and an end portion of the control circuit pattern 32d faces the opening of the recess 32b1 and the high potential circuit pattern 32a that is disposed in the recess 32b1 in plan view. Here, in the ceramic circuit substrate 30, the interconnect wiring region 32b3 is disposed at one end of the center line XL closest to the second side 30b so as to straddle the center line XL, and the control circuit pattern 32d is disposed at the other end of the center line XL closest to the fourth side 30d so as to straddle the center line XL. That is to say, the intermediate potential circuit pattern 32b and the control circuit pattern 32d straddle the center line XL at both ends of the center line XL. This prevents the occurrence of cracks in the ceramic circuit substrate 30. This control circuit pattern 32d has a crank shape with a first vertically extending portion 32d1, a first horizontally extending portion 32d2, and a second vertically extending portion 32d3.

The first vertically extending portion 32d1 is disposed adjacent to the fourth side 30d along the fourth side 30d so as to straddle the center line XL. That is, the first vertically extending portion 32d1 is disposed in a region surrounded by the first cutout 32a1 of the high potential circuit pattern 32a, the edge portion of the chip mounting region 32b4 of the intermediate potential circuit pattern 32b facing the fourth side 30d, and the edge portion of the projecting region 32c1 of the low potential circuit pattern 32c facing the first side 30a. In addition, the first vertically extending portion 32d1 is arranged adjacent to the side portion 32b7 of the chip mounting region 32b4 of the intermediate potential circuit pattern 32b. A side edge of the first vertically extending portion 32d1 facing the fourth side 30d (fourth side surface 70d) is aligned with the side portion (side edge) 32a7 of the high potential circuit pattern 32a and the side portion (side edge) 32c7 (low potential side edge) of the low potential circuit pattern 32c in plan view.

The first horizontally extending portion 32d2 extends vertically from an end of the first vertically extending portion 32d1 closest to the third side 30c toward the second side 30b. That is, the first horizontally extending portion 32d2 is parallel to the center line XL, and is disposed along a gap (first portion) between the second cutout 32b5 and the projecting region 32c1 in the gap. More specifically, the first horizontally extending portion 32d2 is disposed between the edge portion of the second cutout 32b5 of the chip mounting region 32b4 of the intermediate potential circuit pattern 32b facing the third side 30c and the edge portion of the projecting region 32c1 of the low potential circuit pattern 32c facing the first side 30a.

The second vertically extending portion 32d3 extends vertically from an end of the first horizontally extending portion 32d2 closest to the second side 30b toward the third side 30c. More specifically, the second vertically extending portion 32d3 is perpendicular to the center line XL, and is disposed in a gap (second portion) between the edge portion of the second cutout 32b5 facing the fourth side 30d and the edge portion of the projecting region 32c1 facing the second side 30b.

In addition, the interconnect wiring region 32b3 of the intermediate potential circuit pattern 32b is disposed adjacent to the second side 30b so as to straddle the center line XL, and the control circuit pattern 32d is disposed adjacent to the fourth side 30d so as to straddle the center line XL. Therefore, the gap between the chip mounting region 32a4 (high potential circuit pattern 32a) and the chip mounting region 32b4 do not extend over from the second side 30b to the fourth side 30d.

As illustrated in FIG. 6, the ceramic board 51 included in the ceramic circuit substrate 50 has a rectangular frame shape in plan view and has a first side 50a to a fourth side 50d in order. More specifically, the third side 50c is located opposite to the first side 50a on the −Y side thereof. In addition, the fourth side 50d is located opposite to the second side 50b on the −X side thereof. The first and third sides 50a and 50c are short sides, whereas the second and fourth sides 50b and 50d are long sides. The first side 50a to fourth side 50d of the ceramic board 51 face the first side surface 70a to fourth side surface 70d of the cooling base board 70, respectively, and also face the first wall 21a to fourth wall 21d of the case 20, respectively.

Like the circuit pattern 32 of the ceramic circuit substrate 30, the ceramic board 51 has formed thereon a high potential circuit pattern 52a, an intermediate potential circuit pattern 52b, a low potential circuit pattern 52c, and a control circuit pattern 52d.

The high potential circuit pattern 52a has wiring connection regions 52a2 and 52a3 and a chip mounting region 52a4, and has formed therein a first cutout 52a1. The wiring connection region 52a2 is disposed separate from the center line XL toward the first side 50a. In addition, a side portion 52a7 (high potential side edge) of the wiring connection region 52a2 facing the fourth side 50d is disposed adjacent to the fourth side 50d along the fourth side 50d. In addition, a cutout 52a6 at a corner that is located closest to the third side 50c in the edge portion of the high potential circuit pattern 52a facing the second side 50b is formed by shifting the position of the edge portion of the chip mounting region 52a4 facing the third side 50c toward the third side 50c. The high potential circuit pattern 52a has regions similar to those included in the high potential circuit pattern 32a although these regions differ in size.

The intermediate potential circuit pattern 52b has a U shape with an opening facing the fourth side 50d, and includes an output wiring connection region 52b2, an interconnect wiring region 52b3, and a chip mounting region 52b4. In addition, a side portion 52b7 (intermediate potential side edge) of the chip mounting region 52b4 facing the fourth side 50d is located separate from the fourth side 50d toward the second side 50b. The chip mounting region 52b4 has formed therein a second cutout 52b5 at a corner that is located closest to the fourth side 50d in the edge portion of the chip mounting region 52b4 facing the third side 50c. In addition, the output wiring connection region 52b2 extends from the second side 50b to the fourth side 50d along the first side 50a. The output wiring connection region 52b2 has a third cutout 52b6 formed in a portion that is located closest to the fourth side 50d in the edge portion of the output wiring connection region 52b2 facing the third side 50c. In addition, the chip mounting region 52b4 has formed therein a cutout 52b8 at a corner that is located closer to the third side 50c and the second side 50b. The intermediate potential circuit pattern 52b as well has regions similar to those included in the intermediate potential circuit pattern 32b, although these regions differ in size.

The low potential circuit pattern 52c includes projecting regions 52c1 and 52c3 and a conductive region 52c2. As with the conductive region 32c2, the conductive region 52c2 extends from the fourth side 50d to the second side 50b along the third side 50c. The conductive region 52c2 may have a U-shaped portion with a recess in the edge portion thereof facing the third side 50c, and another circuit pattern may be formed in this recess of the U-shaped portion. In addition, the projecting region 52c1 projects toward the first side 50a from a corner portion of the conductive region 52c2 that is located closest to the fourth side 50d in the edge portion of the conductive region 52c2 facing the first side 50a. The projecting region 52c3 projects toward the first side 50a from a corner portion of the conductive region 52c2 that is located closest to the second side 50b in the edge portion of the conductive region 52c2 facing the first side 50a. The projecting region 52c3 is arranged in the cutout 52b8 of the chip mounting region 52b4. In addition, a side portion 52c7 of the low potential circuit pattern 52c facing the fourth side 50d is disposed adjacent to the fourth side 50d.

The control circuit pattern 52d has an L shape with a first vertically extending portion 52d1 and a first horizontally extending portion 52d2. As with the first vertically extending portion 32d1, the first vertically extending portion 52d1 is disposed adjacent to the fourth side 50d along the fourth side 50d so as to straddle the center line XL. More specifically, the first vertically extending portion 52d1 is disposed in a region surrounded by the first cutout 52a1 of the high potential circuit pattern 52a, the edge portion of the chip mounting region 52b4 of the intermediate potential circuit pattern 52b facing the fourth side 50d, and the edge portion of the projecting region 52c1 of the low potential circuit pattern 52c facing the first side 50a. In addition, the first vertically extending portion 52d1 is disposed adjacent to the side portion 52b7 (intermediate potential side edge) of the chip mounting region 52b4 of the intermediate potential circuit pattern 52b and is aligned with the side portion 52a7 of the high potential circuit pattern 52a and the side portion 52c7 (low potential side edge) of the low potential circuit pattern 52c in plan view.

The first horizontally extending portion 52d2 extends vertically from an end of the first vertically extending portion 52d1 closest to the third side 50c toward the second side 50b. More specifically, the first horizontally extending portion 52d2 is disposed between the edge portion of the second cutout 52b5 of the chip mounting region 52b4 of the intermediate potential circuit pattern 52b facing the third side 50c and the edge portion of the projecting region 52c1 of the low potential circuit pattern 52c facing the first side 50a.

When the semiconductor chips 60a to 62a and 60b to 62b heat up, the semiconductor device 10 warps due to a difference in thermal expansion coefficient between the ceramic circuit substrates 30, 40, and 50 and the cooling base board 70. Especially, in the case where the semiconductor device 10 is fixed to a predetermined region using the fastening holes 24a to 24d, the cooling base board 70 is also fixed by the through holes 74a to 74d formed at the four corners thereof, and therefore the ceramic circuit substrates 30, 40, and 50 are not able to follow the warpage of the cooling base board 70 but may crack. Especially, the semiconductor device 10 may warp symmetrically with respect to both center lines XL and YL of FIG. 4. Thus, stress is concentrated on the center lines XL and YL in the ceramic circuit substrates 30, 40, and 50, so that cracks are likely to occur along the center lines XL and YL.

To prevent this, in the ceramic circuit substrates 30, 40, and 50, the control circuit patterns 32d, 42d, and 52d (first vertically extending portions 32d1 and 52d1) are formed on the ceramic boards 31, 41, and 51 so as to straddle their center lines XL, respectively. This increases the strength against cracking that occurs due to stress concentrated on the center lines XL of the ceramic boards 31, 41, and 51, so that the ceramic boards 31, 41, and 51 are less likely to crack.

In addition, in the ceramic circuit substrate 40, the intermediate potential circuit pattern 42b is formed so as to at least partially surround the high potential circuit pattern 42a. This increases the strength against cracking that occurs symmetrically with respect to the center line YL of the ceramic board 41, so that the ceramic board 41 is less likely to crack.

Furthermore, in the ceramic circuit substrates 30 and 50, the control circuit patterns 32d and 52d have the first horizontally extending portions 32d2 and 52d2 that extend vertically from ends of the first vertically extending portions 32d1 and 52d1, respectively. The first vertically extending portions 32d1 and 52d1 have a long strip shape with a narrow width (length in the X direction) and a long length (length in the Y direction). Therefore, a crack may occur between a long side of the first vertically extending portions 32*d*1 and 52*d*1 and another circuit pattern. Such cracks may be prevented by providing the first horizontally extending portions 32*d*2 and 52*d*2 vertically extending from the ends of the first vertically extending portions 32*d*1 and 52*d*1 toward other circuit patterns.

The control circuit pattern 52*d* has an L shape. The control circuit pattern 32*d* has the second vertically extending portion 32*d*3 that extends vertically from an end of the first horizontally extending portion 32*d*2. The first horizontally extending portion 32*d*2 and second vertically extending portions 32*d*3 may have a strip shape with a narrow width and a long length as well. The control circuit pattern 32*d* has a crank shape. This increases the strength against cracking that may occur along the first horizontally extending portion 32*d*2 of the ceramic board 31, so that the ceramic board 31 is less likely to crack. This is the same as the ceramic board 41 including the control circuit pattern 42*d* that has the same shape as the control circuit pattern 32*d*. It is thus possible to prevent a reduction in the reliability of the semiconductor device 10.

Figure 7:
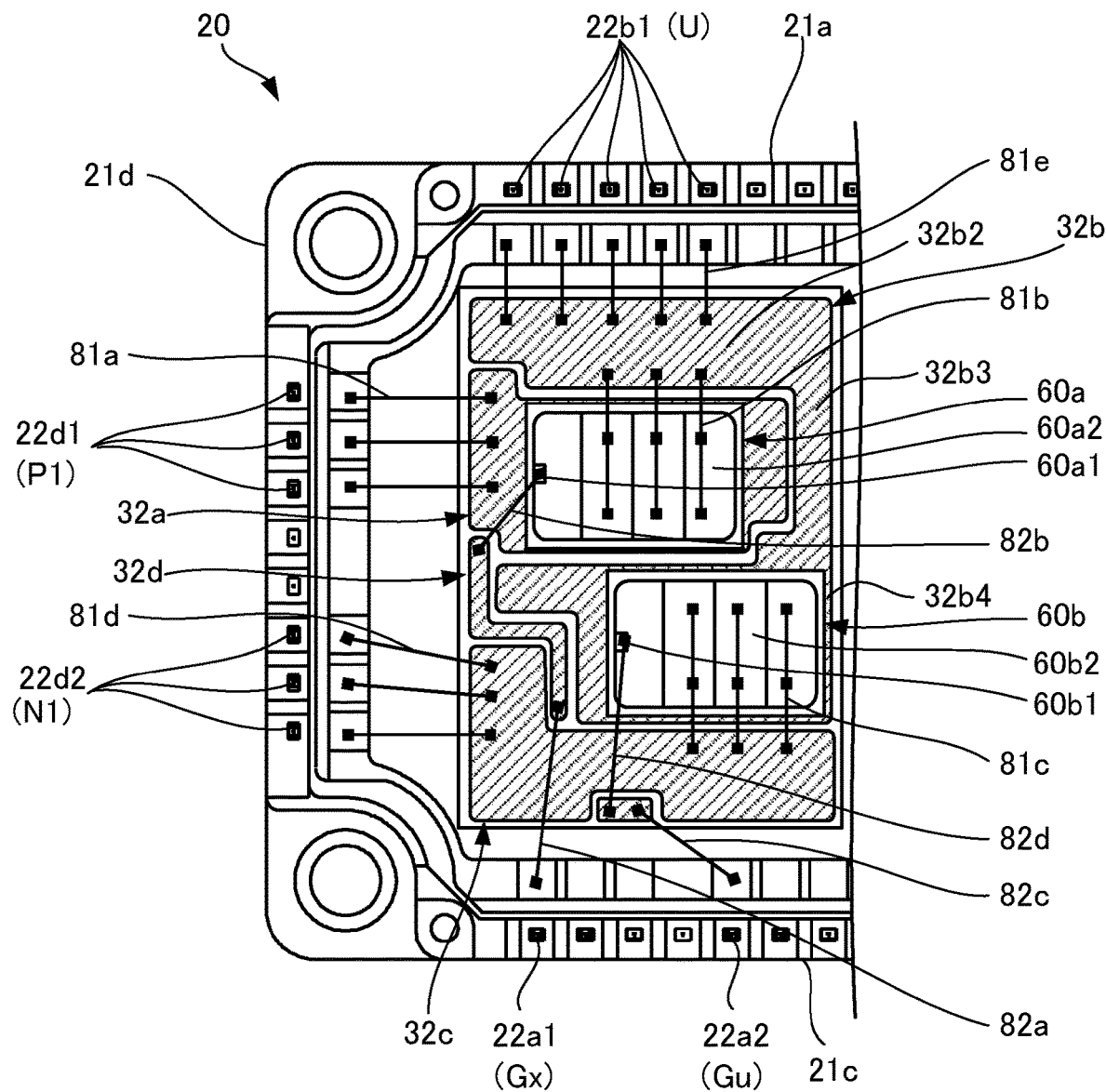
FIG. 7 illustrates a wiring layout of the semiconductor device according to the embodiment.
Figure 8:
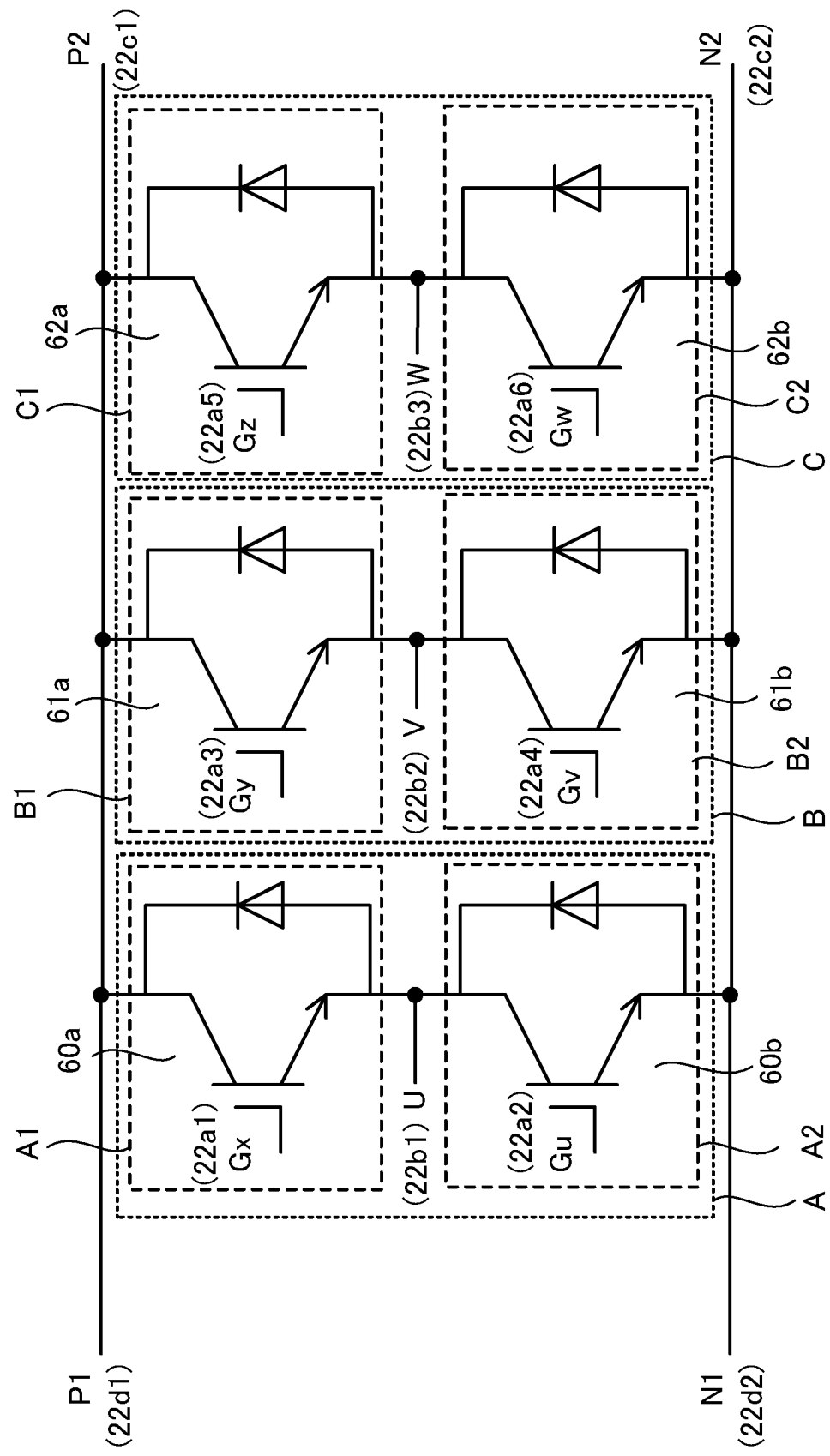
FIG. 8 is a circuit diagram illustrating an equivalent circuit of the semiconductor device according to the embodiment.

The following describes the flow and output of current in the semiconductor device 10 with reference to FIGS. 7 and 8 (and FIG. 2). FIG. 7 illustrates a wiring layout of the semiconductor device according to the present embodiment. FIG. 8 is a circuit diagram illustrating an equivalent circuit of the semiconductor device according to the present embodiment. In this connection, FIG. 7 is an enlarged view of the ceramic circuit substrate 30 of FIG. 2.

As illustrated in FIG. 8, the semiconductor device 10 has three legs A, B, and C. The legs A, B, and C covert direct current input from the high potential second P terminals 22*c*1 and first P terminals 22*d*1 and the low potential second N terminals 22*c*2 and first N terminals 22*d*2 and output three-phase alternating current from the U terminals 22*b*1, V terminals 22*b*2, and W terminals 22*b*3.

The leg A includes an upper arm A1 and a lower arm A2. The leg A is formed of the ceramic circuit substrate 30, the semiconductor chips 60*a* and 60*b* forming the upper and lower arms A1 and A2, and wires 80 electrically connecting these. This leg A has a connection from the high potential first P terminals 22*d*1 to an input electrode formed on the rear surface of the semiconductor chip 60*a* forming the upper arm A1, via main current wires 81*a* and the high potential circuit pattern 32*a*. In this connection, as illustrated in FIG. 2, the high potential circuit pattern 32*a* is connected to the high potential circuit pattern 42*a* of the ceramic circuit substrate 40 with main current wires. The high potential circuit pattern 42*a* is connected to the high potential circuit pattern 52*a* of the ceramic circuit substrate 50 with main current wires. The high potential circuit pattern 52*a* is connected to the high potential second P terminals 22*c*1 with main current wires. With this configuration, the first P terminals 22*d*1 are electrically connected to the second P terminals 22*c*1.

An output electrode 60*a*2 on the front surface of the semiconductor chip 60*a* is connected to the U terminals 22*b*1 via main current wires 81*b*, the intermediate potential circuit pattern 32*b* (output wiring connection region 32*b*2), and main current wires 81*e*.

In addition, the U terminals 22*b*1 are connected to an input electrode formed on the rear surface of the semiconductor chip 60*b* forming the lower arm A2, via the main current wires 81*e* and intermediate potential circuit pattern 32*b*. Then, an output electrode 60*b*2 on the front surface of the semiconductor chip 60*b* is electrically connected to the low potential first N terminals 22*d*2 via main current wires 81*c*, the low potential circuit pattern 32*c*, and main current wires 81*d* connecting to the low potential circuit pattern 32*c*. The main current wires 81*c* extend in the opposite direction of the main current wires 81*b*. In this connection, as illustrated in FIG. 2, the low potential circuit pattern 32*c* is connected to the low potential circuit pattern 42*c* of the ceramic circuit substrate 40 via main current wires. The low potential circuit pattern 42*c* is connected to the low potential circuit pattern 52*c* of the ceramic circuit substrate 50 via main current wires. Then, the low potential circuit pattern 52*c* is connected to the low potential second N terminals 22*c*2 with main current wires. With this configuration, the first N terminals 22*d*2 are electrically connected to the second N terminals 22*c*2.

The Gx terminal 22*a*1 that is a control terminal is connected to the control electrode 60*a*1 of the semiconductor chip 60*a* forming the upper arm A1, via a control wire 82*a*, the control circuit pattern 32*d*, and a control wire 82*b*. The Gu terminal 22*a*2 that is a control terminal is connected to the control electrode 60*b*1 of the semiconductor chip 60*b* forming the lower arm A2, via control wires 82*c* and 82*d*. The following description will be made with reference to FIG. 2.

The leg B includes an upper arm B1 and a lower arm B2. The leg B is formed of the ceramic circuit substrate 40, the semiconductor chips 61*a* and 61*b* forming the upper and lower arms B1 and B2, and wires 80 electrically connecting these. This leg B has a connection from the high potential first P terminals 22*d*1 to an input electrode formed on the rear surface of the semiconductor chip 61*a* forming the upper arm B1, via the main current wires 81*a*, the high potential circuit pattern 32*a*, main current wires, and the high potential circuit pattern 42*a*. As described earlier, the high potential circuit pattern 42*a* is connected to the high potential second P terminals 22*c*1 (see FIG. 2). An output electrode on the front surface of the semiconductor chip 61*a* is connected to the V terminals 22*b*2 via main current wires, the intermediate potential circuit pattern 42*b*, and main current wires.

In addition, the V terminals 22*b*2 are connected to an input electrode formed on the rear surface of the semiconductor chip 61*b* forming the lower arm B2, via the main current wires and the intermediate potential circuit pattern 42*b*. An output electrode on the front surface of the semiconductor chip 61*b* is electrically connected to the low potential first N terminals 22*d*2 via main current wires, the low potential circuit pattern 42*c*, main current wires connecting to the low potential circuit pattern 42*c*, the low potential circuit pattern 32*c*, and the main current wires 81*d*. In this connection, as described earlier, the low potential circuit pattern 42*c* is electrically connected to the low potential second N terminals 22*c*2.

The Gy terminal 22*a*3 that is a control terminal is connected to the control electrode of the semiconductor chip 61*a* forming the upper arm B1, via a control wire, the control circuit pattern 42*d*, and a control wire. The Gv terminal 22*a*4 that is a control terminal is connected to the control electrode of the semiconductor chip 61*b* forming the lower arm B2 via control wires.

The leg C includes an upper arm C1 and a lower arm C2. The leg C is formed of the ceramic circuit substrate 50, the semiconductor chips 62*a* and 62*b* forming the upper and lower arms C1 and C2, and wires 80 electrically connecting these. This leg C has a connection from the high potential first P terminals 22*d*1 to an input electrode formed on the rear surface of the semiconductor chip 62a forming the upper arm C1, via the main current wires 81a, the high potential circuit pattern 32a, the main current wires, the high potential circuit pattern 42a, the main current wires, and the high potential circuit pattern 52a. As described earlier, the high potential circuit pattern 52a is connected to the high potential second P terminals 22c1. An output electrode on the front surface of the semiconductor chip 62a is connected to the W terminals 22b3 via main current wires, the intermediate potential circuit pattern 52b, and main current wires.

In addition, the W terminals 22b3 are connected to an input electrode formed on the rear surface of the semiconductor chip 62b forming the lower arm C2, via the main current wires and the intermediate potential circuit pattern 52b. An output electrode on the front surface of the semiconductor chip 62b is electrically connected to the low potential first N terminals 22d2 via main current wires, the low potential circuit pattern 52c, the main current wires connecting to the low potential circuit pattern 52c, the low potential circuit pattern 42c, the main current wires, the low potential circuit pattern 32c, and the main current wires 81d. In this connection, as described earlier, the low potential circuit pattern 52c is electrically connected to the low potential second N terminals 22c2.

The Gz terminal 22a5 that is a control terminal is connected to the control electrode of the semiconductor chip 62a forming the upper arm C1, via a control wire, the control circuit pattern 52d, and a control wire. The Gw terminal 22a6 that is a control terminal is connected to the control electrode of the semiconductor chip 62b forming the lower arm C2 via control wires.

In the semiconductor device 10, an input is made from the high potential second P terminals 22c1 and first P terminals 22d1 and the low potential second N terminals 22c2 and first N terminals 22d2, and a signal is input from the Gx, Gu, Gy, Gv, Gz, and Gw terminals 22a1 to 22a6 at predetermined timing, so that three-phase alternating current is output from the U terminals 22b1, V terminals 22b2, and W terminals 22b3.

The above-described semiconductor device 10 includes semiconductor chips 60a to 62a and 60b to 62b, a cooling base board 70, and ceramic circuit substrates 30, 40, and 50. The cooling base board 70 is rectangular in plan view, has a first side surface 70a to a fourth side surface 70d in order, and has a center line XL that passes through the center thereof in parallel to the first side surface 70a and third side surface 70c. The ceramic circuit substrates 30, 40, and 50 each include a ceramic board 31, 41, 51, and on the front surface of the ceramic board 31, 41, 51, a high potential circuit pattern 32a, 42a, 52a on which one of the semiconductor chips 60a to 62a is mounted, an intermediate potential circuit pattern 32b, 42b, 52b on which one of the semiconductor chips 60b to 62b is mounted, a low potential circuit pattern 32c, 42c, 52c, and a control circuit pattern 32d, 42d, 52d, and are disposed on the front surface of the cooling base board 70 so as to straddle the center line XL. The high potential circuit pattern 32a, 42a, 52a has a chip mounting region 32a4, 52a4, on which the one of the semiconductor chips 60a to 62a is mounted, adjacent to the center line XL on the side thereof closer to the first side surface 70a. The intermediate potential circuit pattern 32b, 42b, 52b has a U-shape with an opening facing the fourth side surface 70d, and has a U-shaped portion (with a recess 32b1, 52b1) that at least partially surrounds at least a part of the chip mounting region 32a4, 52a4, a chip mounting region 32b4, 52b4 which is disposed adjacent to the center line XL on the side thereof closer to the third side surface 70c and on which the one of the semiconductor chips 60b to 62b is mounted, an output wiring connection region 32b2, 52b2 that faces the chip mounting region 32b4, 52b4 with the recess 32b1, 52b1 therebetween, and an interconnect wiring region 32b3, 52b3 disposed so as to straddle the center line XL and connect the chip mounting region 32b4, 52b4 and the output wiring connection region 32b2, 52b2. The control circuit pattern 32d, 42d, 52d is disposed on the opening side of the recess 32b1, 52b1 so as to straddle the center line XL. With this configuration, in each ceramic circuit substrate 30, 40, and 50, the control circuit pattern 32d, 42d, 52d straddles the center line XL on the ceramic board 31, 41, 51. This increases the strength against cracking that may occur symmetrically with respect to the center line XL of the ceramic board 31, 41, 51, so that the ceramic board 31, 41, and 51 is less likely to crack. Thus, a reduction in the reliability of the semiconductor device 10 is prevented.

The disclosed technique makes it possible to prevent damage to a ceramic circuit substrate and to thereby prevent a reduction in the reliability of a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor device, comprising:
first and second semiconductor chips;
a cooling base board that is rectangular in a plan view of the semiconductor device, and has a first side, a second side, a third side and a fourth side in this order; and
an insulated circuit substrate disposed on a front surface of the cooling base board so as to straddle a center line of the cooling base board that passes through a center of the cooling base board in a direction parallel to the first side and the third side, the insulated circuit substrate including an insulating plate and further including, on a front surface of the insulating plate, a high potential circuit pattern on which the first semiconductor chip is mounted, an intermediate potential circuit pattern on which the second semiconductor chip is mounted, a low potential circuit pattern, and a control circuit pattern, wherein
the high potential circuit pattern includes a first chip mounting region adjacent to the center line at a side of the center line where the first side is located, the first chip mounting region having the first semiconductor chip mounted thereon,
the intermediate potential circuit pattern includes:
a second chip mounting region adjacent to the center line on a side of the center line where the third side is located, the second chip mounting region having the second semiconductor chip mounted thereon;
an output wiring connection region facing the second chip mounting region; and
an interconnect wiring region disposed so as to straddle the center line and connect the second chip mounting region and the output wiring connection region, the second chip mounting region, the output wiring connection region and the interconnect wiring region forming a U-shaped portion in the plan view with an opening facing the fourth side, the U-shaped portion partially surrounding at least a part of the first chip mounting region, and the control circuit pattern is disposed so as to straddle the center line and faces the opening of the U-shaped portion.

2. The semiconductor device according to claim 1, wherein the low potential circuit pattern faces the first chip mounting region with the second chip mounting region therebetween.

3. The semiconductor device according to claim 1, wherein the control circuit pattern is disposed on a side of the first chip mounting region and the second chip mounting region where the fourth side is located.

4. The semiconductor device according to claim 3, wherein
the high potential circuit pattern has a first cutout at a corner thereof that is located closest to the third side at a high potential side edge of the high potential circuit pattern facing the fourth side, and
the control circuit pattern is arranged in the first cutout.

5. The semiconductor device according to claim 4, wherein
an intermediate potential side edge of the second chip mounting region of the intermediate potential circuit pattern facing the fourth side is located closer to the second side than are the high potential side edge of the high potential circuit pattern facing the fourth side and a low potential side edge of the low potential circuit pattern facing the fourth side, and
the control circuit pattern includes a first vertically extending portion that is disposed adjacent to the intermediate potential side edge of the second chip mounting region of the intermediate potential circuit pattern, a side edge of the first vertically extending portion of the control circuit pattern being aligned with the high potential side edge of the high potential circuit pattern and the low potential side edge of the low potential circuit pattern in the plan view.

6. The semiconductor device according to claim 5, wherein
the intermediate potential circuit pattern has a second cutout at a corner thereof that is located closest to the third side at the intermediate potential side edge of the second chip mounting region of the intermediate potential circuit pattern,
the low potential circuit pattern includes a projecting region arranged in the second cutout, and
the control circuit pattern further includes a first horizontally extending portion along a gap between the second cutout and the projecting region.

7. The semiconductor device according to claim 6, wherein
the second cutout is rectangular in the plan view, and
the gap between the projecting region of the low potential circuit pattern and the second cutout includes a first portion in parallel to the center line.

8. The semiconductor device according to claim 7, wherein
the gap further includes a second portion that is perpendicular to the center line and connects to the first portion, and the control circuit pattern further includes a second vertically extending portion that is arranged along the second portion in the gap, thereby to have a crank shape.

9. The semiconductor device according to claim 1, wherein
the first semiconductor chip includes a first main electrode on a front surface thereof, and
the semiconductor device further includes a first main current wire that extends in parallel to the second side and the fourth side to connect the first main electrode and the output wiring connection region.

10. The semiconductor device according to claim 9, wherein
the first side has an output terminal, and
the semiconductor device further includes a second main current wire that extends in parallel to the second side and the fourth side to connect the output terminal and the output wiring connection region.

11. The semiconductor device according to claim 9, wherein
the second semiconductor chip has a second main electrode on a front surface thereof, and
the semiconductor device further includes a second main current wire that extends in parallel to the second side and the fourth side to connect the second main electrode and the low potential circuit pattern.

12. The semiconductor device according to claim 9, wherein
the fourth side or the second side has a high potential terminal that faces the high potential circuit pattern, and
the semiconductor device further includes a high potential main current wire that extends in parallel to the first side and the third side to connect the high potential terminal and the high potential circuit pattern.

13. The semiconductor device according to claim 9, wherein
the fourth side or the second side has a low potential terminal that faces the low potential circuit pattern, and
the semiconductor device further includes a low potential main current wire that extends in parallel to the first side and the third side to connect the low potential terminal and the low potential circuit pattern.

14. The semiconductor device according to claim 9, wherein
the first semiconductor chip has a first control electrode on a front surface thereof,
the third side has a first control terminal that faces the low potential circuit pattern, and
the semiconductor device further includes a first control wire that connects the first control terminal and the first control electrode via the control circuit pattern.

15. The semiconductor device according to claim 9, wherein
the second semiconductor chip has a second control electrode on a front surface thereof,
the third side has a second control terminal that faces the low potential circuit pattern, and
the semiconductor device further includes a second control wire that connects the second control terminal and the second control electrode via the low potential circuit pattern.

16. The semiconductor device according to claim 1, wherein the cooling base board has through holes for fastening at respective four corners thereof.

17. The semiconductor device according to claim 1, wherein the insulated circuit substrate is provided in plurality, and the plurality of insulated circuit substrates are disposed along the center line on the cooling base board.

\* \* \* \* \*